United States Patent
Pasotti et al.

[11] Patent Number: 6,091,642
[45] Date of Patent: Jul. 18, 2000

[54] METHOD FOR CONTROLLED ERASING MEMORY DEVICES, IN PARTICULAR ANALOG AND MULTI-LEVEL FLASH-EEPROM DEVICES

[75] Inventors: Marco Pasotti, S. Martino Siccomario; Roberto Canegallo, Tortona; Ernestina Chioffi, Pavia; Giovanni Guaitini, Trecella; Frank Lhermet, Vimercate; Pierluigi Rolandi, Monleale, all of Italy

[73] Assignee: STMicroelectronics, S.r.l., Agrate Brianza, Italy

[21] Appl. No.: 09/234,942

[22] Filed: Jan. 21, 1999

[30] Foreign Application Priority Data

Jan. 22, 1998 [EP] European Pat. Off. ............ 98830024

[51] Int. Cl.⁷ .................................................. G11C 16/04
[52] U.S. Cl. ............................ 365/185.29; 365/185.24; 365/185.3
[58] Field of Search ........................ 365/185.21, 185.22, 365/185.24, 185.29, 185.3

[56] References Cited

U.S. PATENT DOCUMENTS

| | | | |
|---|---|---|---|
| 5,508,959 | 4/1996 | Lee et al. ................................ | 365/185.3 |
| 5,568,419 | 10/1996 | Atsumi et al. ......................... | 365/185.3 |
| 5,602,789 | 2/1997 | Endoh et al. ......................... | 365/185.17 |
| 5,608,672 | 3/1997 | Tang et al. ............................ | 365/185.3 |
| 5,636,162 | 6/1997 | Coffman et al. .................... | 365/185.22 |
| 5,642,311 | 6/1997 | Cleveland et al. ................... | 365/185.3 |
| 5,745,410 | 4/1998 | Yiu et al. .............................. | 365/185.3 |

FOREIGN PATENT DOCUMENTS 0 704 853 A2  4/1996  European Pat. Off. .

*Primary Examiner*—Son Mai
*Attorney, Agent, or Firm*—Theodore E. Galanthay; Robert Iannucci; Seed IP Law Group, PLLC

[57] ABSTRACT

The controlled erase method includes supplying at least one erase pulse to cells of a memory array; comparing the threshold voltage of the erased cells with a low threshold value; selectively soft-programming the erased cells which have a threshold voltage lower than the low threshold value; and verifying whether the erased cells have a threshold voltage lower than a high threshold value, which is higher than the low threshold value. If at least one predetermined number of erased cells has a threshold voltage which is higher than the high threshold value, an erase pulse is applied to all the cells and the steps of comparing, selectively soft-programming and verifying are repeated.

12 Claims, 4 Drawing Sheets

METHOD FOR CONTROLLED ERASING MEMORY DEVICES, IN PARTICULAR ANALOG AND MULTI-LEVEL FLASH-EEPROM DEVICES

TECHNICAL FIELD

The present invention relates to a method for controlled erasing nonvolatile memory devices, in particular analog and multi-level flash-EEPROM devices.

BACKGROUND OF THE INVENTION

As is known, two main problems are encountered when flash cells are erased, after application of one or more erase pulses, i.e., some of the cells are erased excessively, so that they have a negative threshold voltage (depleted cells); and after a long erase pulse the dispersion of the threshold voltages is large (up to approximately 3 V).

Furthermore, after erasing, in order to permit subsequently correct data storage, in particular if the memory is of the analog or multi-level type and storage of different digital values or analog values is involved, no depleted cells should be present, and the cells cannot have a threshold voltage which is lower than a specific value. The aforementioned requirements cannot be met when, in addition to cells which behave correctly, there are cells which, at each erase pulse, modify their threshold voltage too little, as well as cells which modify their threshold voltage excessively.

At present, erasing is carried out such that its duration is minimised, without imposing excessively narrow constraints on the final distribution of the threshold voltage. For this purpose, erasing is generally carried out by supplying erase pulses of a predetermined duration (for example 10 ms), each followed by an erase verify step on a subassembly of cells (which normally all belong to a whole row of the sector which is being erased). If at least one cell of the subassembly does not pass the verify step (since it has a threshold which is higher than a predetermined value), a new erase pulse is supplied. When all the cells of the subassembly pass the verify step, the entire sector is verified until a percentage near 100% (e.g., 98%) passes the verifying step. At the end of erasing, in order to recover depleted cells, a soft-programming pulse is generated (i.e., by supplying a gate voltage $V_G$ of 7 V, and a drain voltage $V_D$ of 7 V for a period of approximately 5 ms), blindly to all the cells.

However the above-described erase method cannot provide the requirements of dispersion amplitude and low average value necessary for analog or multi-level programming.

SUMMARY OF THE INVENTION

An advantage of the invention is thus to provide an erase method which makes it possible to obtain the aforementioned requirements.

According to an aspect of the present invention, a method for controlled erasing non-volatile memory devices, in particular analog and multi-level flash-EEPROM devices begins by supplying at least one erase pulse to the cells of a memory array and verifying that the erased cells have a threshold voltage that is lower than a first threshold value. The method continues by comparing the erased cells to a second threshold value and soft-programming the cells that have a threshold voltage lower than the second threshold voltage.

BRIEF DESCRIPTION OF THE DRAWINGS

To assist understanding of the present invention, a preferred embodiment is now described, purely by way of non-limiting example, with reference to the attached drawings.

DETAILED DESCRIPTION OF THE INVENTION

Figure 1:
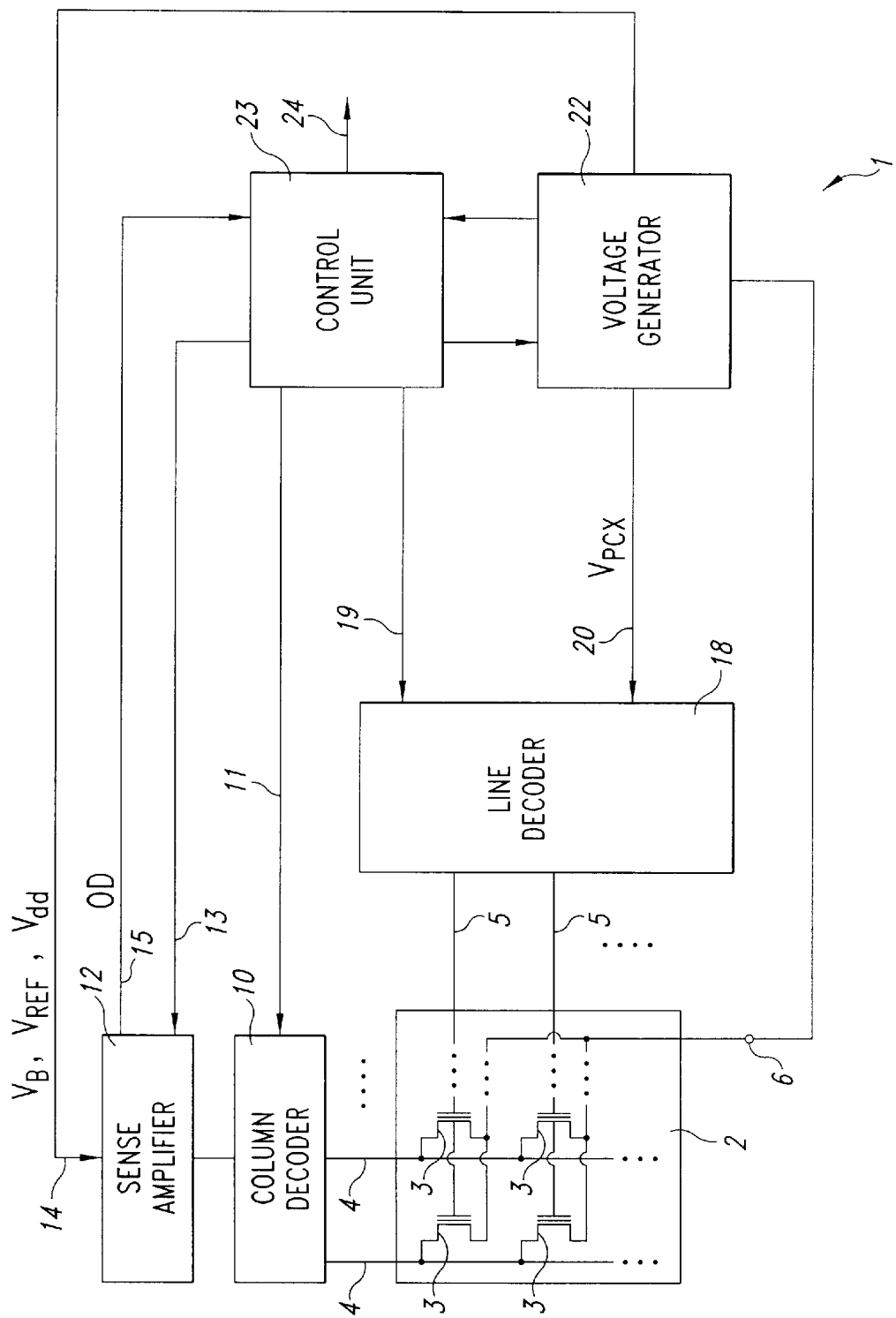
FIG. 1 shows a simplified block diagram of a flash memory of a known type.

FIG. 1 shows the blocks of a memory 1, which assist during erasing. In detail, in the memory 1, there is shown an array 2 comprising a plurality of cells 3 arranged on rows and columns and connected to respective bit lines 4 and word lines 5. In detail, and in known manner, the cells 3 which are disposed on a single column have drain terminals connected to a single bit line 4; the cells 3 which are disposed on a single row have gate terminals connected to a single word line 5, and all the source terminals are connected to one another and are available outside the array 2 through a common source terminal 6. In a known manner, if the array 2 were divided into sectors, the common source terminals 6 would be separated for the various sectors.

Figure 2:
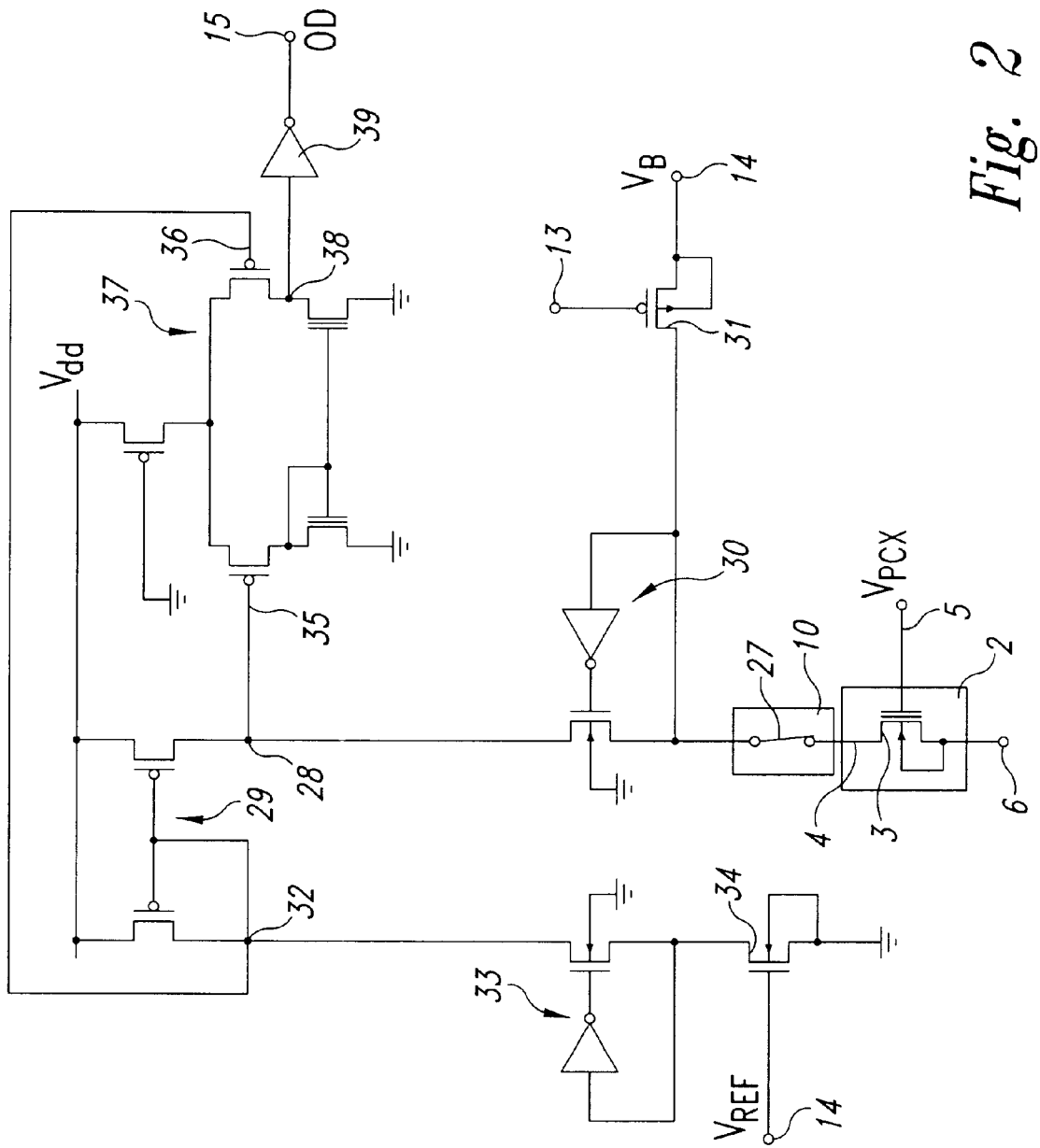
FIG. 2 shows a circuit diagram of a block of FIG. 1.

The bit lines 4 are connected to a column decoder 10, which, as specified by address signals supplied to a control input 11 of the decoder, connects the bit lines 4 selectively in a known manner to a bias and read circuit (sense amplifier 12), which is shown in greater detail in FIG. 2. Sense amplifier 12 has a control input 13, a bias input 14 receiving voltages $V_B$ and $V_{REF}$ as well as the supply voltage $V_{dd}$ and an output 15, to which output data OD are supplied. Similarly, word lines 5 are connected to a row decoder 18 having a control input 19 which receives address signals, and a bias input 20 which receives a voltage $V_{PCX}$.

Bias and supply voltages $V_B$, $V_{REF}$, $V_{dd}$ and $V_{PCX}$ are generated by a generator stage 22 connected to the common source terminal 6, which is controlled by a control unit 23, and in turn supplies the control unit 23. The latter (which comprises e.g., a state machine) supplies address signals to column decoders 10 and row decoders 18, receives output signal OD from sense amplifier 12, and has an output 24 for connection to the other parts (not shown) of memory 1.

The structure of sense amplifier 12 is shown in detail in FIG. 2, and is described here briefly only, since it is of a conventional type. In FIG. 2, of the array 2, there is shown a single cell 3, connected to a first node 28 of a current mirror circuit 29 via a switch 27 belonging to column decoder 10 and to a cell bias circuit 30. Cell bias circuit 30 is connected to a control transistor 31 of PMOS type, which has a gate terminal connected to input 13 and a source terminal connected to input 14, and receives voltage $V_B$, which, neglecting the voltage drop on control transistor 31, is applied to the drain terminal of cell 3, as planned in the various reading and writing steps of cell 3.

Current mirror circuit 29 has a second node 32 connected via a reference bias circuit 33 to a reference transistor 34 of NMOS type, which has a source terminal connected to ground and a gate terminal connected to input 14 of sense amplifier 12, and which receives voltage $V_{REF}$. Reference bias circuit 33 has the same structure as cell bias circuit 30, but is not connected to any control transistor.

Nodes 28 and 32 of current mirror circuit are connected respectively to a first and a second input node 35 and 36 of a single-ended differential circuit 37 of MOS type, per se known and not described further, the output node 38 of which is connected to output terminal 15 of sense amplifier 12 via an inverter 39.

In a known manner, when appropriate voltage values $V_{PCX}$ and $V_{REF}$ are supplied to word line 5 of connected cell 3, and to the input 14, sense amplifier 12 compares the currents flowing in cell 3 and in reference transistor 34 and generates a first logic state (in this case a "1") of signal OD, if the threshold voltage of cell 3 is lower than a value which is correlated to voltage $V_{REF}$ and vice versa. In addition, since comparison is made in current, the greater is the voltage value compared to the threshold voltage of cell 3, the smaller is the reference voltage $V_{REF}$ supplied to reference transistor 34.

Figure 3:
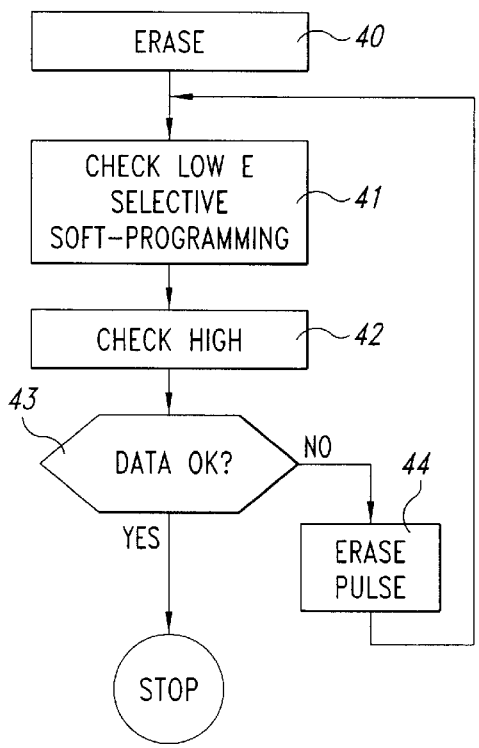
FIGS. 3–5 are flowcharts relative to the present method.

On this basis, the method for controlled erasing array 2 is now described with reference to FIG. 3 and to circuit diagrams of FIGS. 1 and 2. Initially, block 40, a first erasing pulse is applied. For this purpose, for a predetermined period of, for example 10 ms, a voltage of 10 V is supplied to common source terminal 6, voltage $V_{PCX}$ of all word lines 5 is set to ground (0 V), and all bit lines 4 are left floating (by opening all switches 27 of column decoder 10).

Then, block 41, a low threshold verify step ("check low") is carried out on all cells of the array (or of the erased sector); if one or more cells 3 is over-erased, i.e., if its threshold is lower than a first threshold value $V_{th1}$, selective "soft" programming is carried out only of the over-erased cell or cells, as described in detail hereinafter with reference to FIG. 4.

Subsequently, block 42, a high threshold verify step ("check high") is carried out; if all cells have a threshold voltage lower than a second threshold value $V_{th2}$ but greater than the first (YES output from block 43), the erase process is terminated; in the opposite case (NO output), a further erase pulse is supplied (block 44) and the described process is repeated from beginning.

Figure 4:
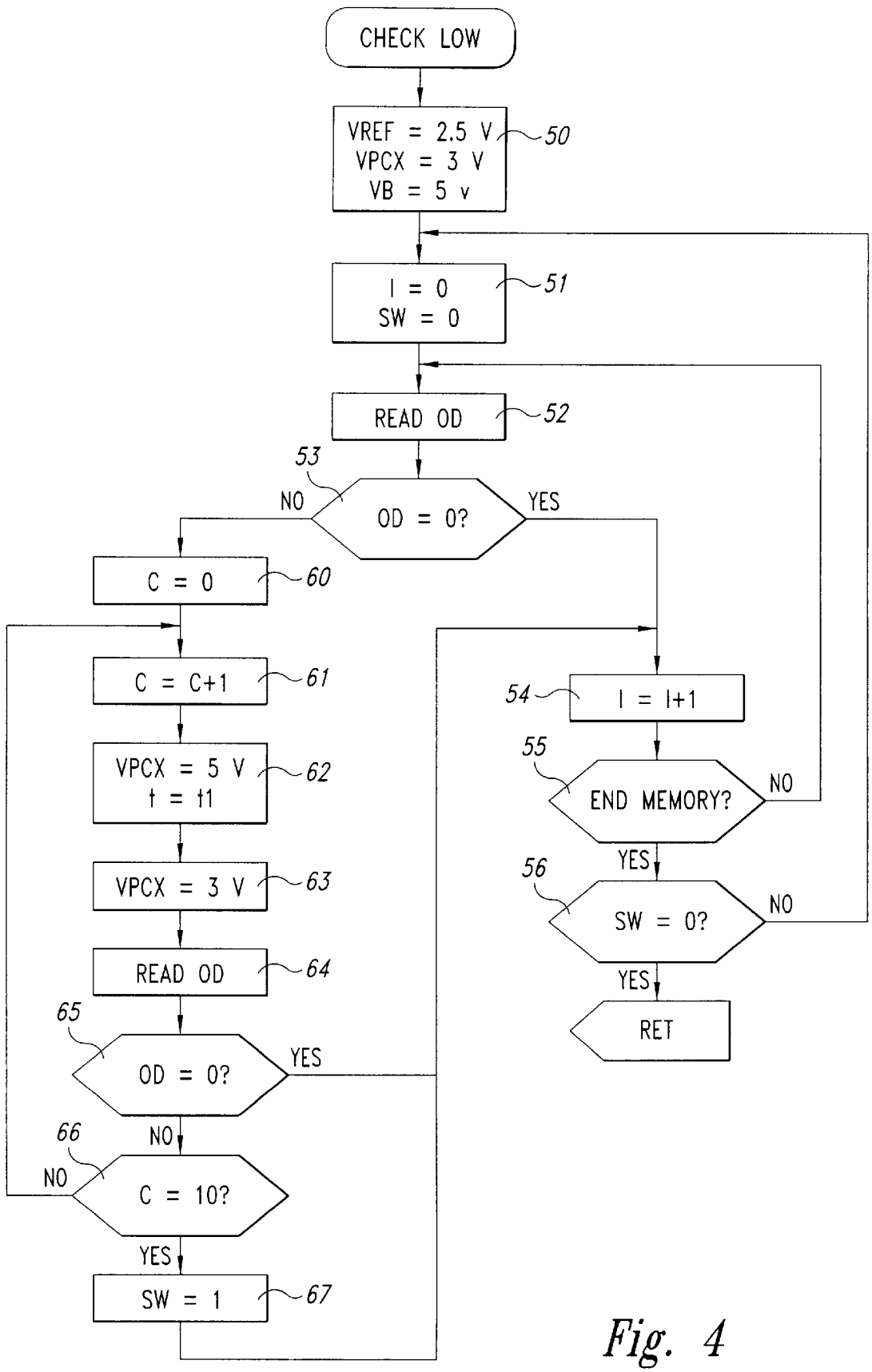

With reference to FIG. 4, the low threshold verify step is now described in detail. In particular, this step takes into account that incorrect reading of an addressed cell can be caused not by the addressed cell itself, but by another depleted cell in the same column, which conducts even if it is not addressed (with a zero gate voltage); consequently if there is a depleted cell in a column, it is not always possible to locate this cell accurately and immediately. In this case, as described hereinafter in detail, the cell which gives rise to incorrect reading receives a series of soft programming pulses and is read once more after each soft pulse; if at a given moment this cell generates a correct reading, low threshold of the next cell takes place; on the other hand if, after a predetermined number of pulses and corresponding verify steps, the cell still appears to be over-erased, the process continues by verifying the successive cells, and the anomaly encountered is stored by a flag. After verifying all cells of the memory (or of the erased sector), if the flag indicates the described abnormal situation, an entire low threshold verify process is repeated once more on the entire memory, using the same methods previously described. Thereby, in general it is possible to correct an over-erase condition, even if the over-erased cell is not located correctly within a column.

Therefore, with reference to FIG. 4, reference voltage $V_{REF}$ applied to reference transistor 34 in FIG. 2 is set for example to 2.5 V, voltage $V_{PCX}$ supplied to row decoder 18 is set to 3 V, and voltage $V_B$ is set to 5 V, block 50. Then, a cell counter I (used to address each time a single cell to be verified) and the flag, indicated SW, are initialized to zero, block 51. Output signal OD is then read by sense amplifier 12 (block 52); as explained earlier with reference to FIG. 2, if threshold voltage of read cell 3 is lower than first predetermined value $V_{th1}$ correlated to voltage $V_{REF}$, (cell 3 conducting), the output signal is equal to 0, and in the opposite condition it is equal to 1. It is then checked whether OD is equal to 0, block 53; if this is the case (YES output), counter I is incremented for verifying a successive cell, block 54. It is then checked whether the entire memory has not already been verified (block 55); if not, the program returns to block 52 for reading a successive cell; if the entire memory has been verified, it is checked whether flag SW is equal to 0. If this is the case (low threshold verify correct for all the cells of the memory), the process ends; if this is not the case, the program returns to block 51 for repetition of the low threshold verify step on the entire memory (or memory sector).

If, during verify of a cell 3, the latter is found to be over-erased, and thus output signal OD is equal to 1 (NO output from block 53), soft-programming of the over-erased cell is carried out. In detail, block 60, a repetition counter C is initially set to zero; repetition counter C is then incremented by one unit (block 61); voltage $V_{PCX}$ (applied to the word line which is connected to the cell to be soft-programmed) is set to 5 V for a predetermined time t1(e.g., 1 ms), block 62, whereas drain voltage $V_D$, remains at approximately 5 V, such that a programming pulse is applied to the depleted cell 3. Voltage $V_{PCX}$ is then set once more to the reading value of 3 V, block 63, and the threshold voltage of just soft-programmed cell 3 is read (block 64). The value of output signal OD is then checked (block 65); if this is equal to 0, i.e., if the just soft-programmed cell is no longer in the over-erased condition, the process continues with verifying a successive cell, with return to block 54; if this is not the case, it is checked whether a predetermined number of soft-programming pulses, for example 10, has already been supplied, block 66. If not, there is a return to block 61, counter C is incremented, and a further soft-programming pulse is supplied to depleted cell 3; if yes, anomaly flag SW is set to 1, block 67, and verify continues with successive cells.

Figure 5:
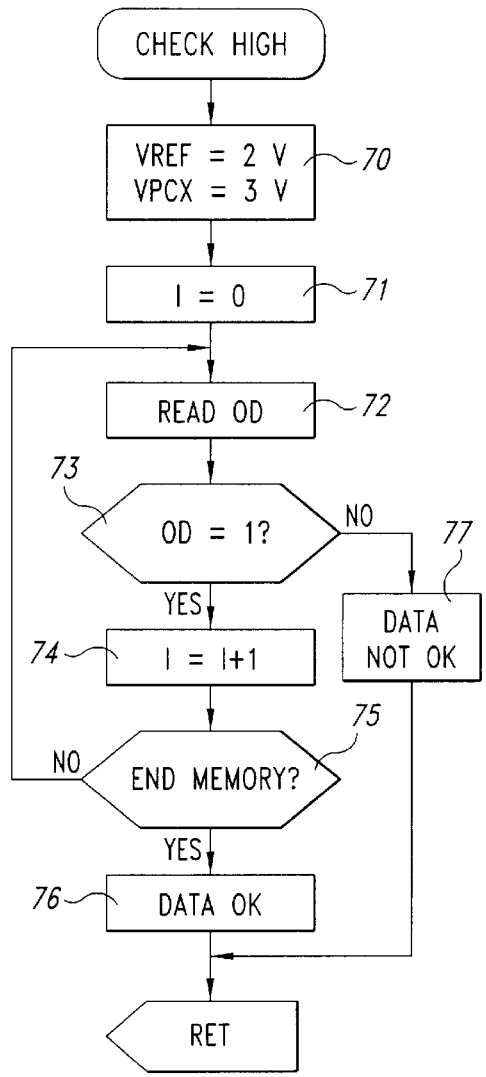

The high threshold verify process is now described with reference to FIG. 5. Initially, voltage $V_{REF}$, is set to 2 V, and voltage $V_{PCX}$ is set to 3 V (which, as already explained, corresponds to comparing threshold voltage of cells 3 with second threshold value $V_{th2}$, which is greater than $V_{th1}$), block 70. Cell counter I is then initialized to zero, block 71, and verify reading of the first cell is carried out, acquiring the logic value of output signal OD, block 72. It is then checked whether this logic value is equal to 1 (corresponding to the situation in which cell 3 is conducting, i.e., when it has a threshold voltage which is lower than the second value), block 73; if this is not the case, an incorrect datum indicator is set, block 77, and the high threshold verify process terminates; if the result is positive, counter I is incremented, block 74, in order to address a successive cell, and it is checked whether the entire memory has been examined, block 75. If further cells 3 of the memory need to be verified, NO output from block 75, there is a return to reading block 72 of output signal OD for the successive cell; otherwise, YES output, a correct datum indicator is set, block 76, and the high threshold verify process ends.

The described erase method has the advantage that it provides for a close distribution of threshold voltages of the erased cells (and more specifically, it is possible to set the distribution amplitude by appropriate selection of voltage values $V_{REF}$ during the low and high threshold verify steps), as well as the average value of the threshold voltages. The erase method can be carried out by circuitry and steps already present in the memory, without requiring structural modifications of the latter, on the basis of a program stored in control unit 23.

Finally, it is apparent that numerous changes and variants can be made to the described and illustrated method, all of which come within the scope of the inventive concept, as defined in the attached claims. For example, instead of measuring a single cell which is not sufficiently erased, as described above, a new programming pulse and repetition of the low and high threshold verify steps can be applied only if the cells which are not sufficiently erased are greater than a specific number, or in the case of a large difference between the high threshold voltage to be compared and the threshold voltage of the insufficiently erased cell, if the memory includes circuitry which makes it possible to detect this difference. In addition, it is possible to carry out high threshold and low threshold verify reading, and to supply the soft-programming pulses in parallel to several cells (e.g., eight or sixteen cells connected to the same word line 5), by providing appropriate parallel reading circuits (similarly to the process normally used at present for reading the cells), as well as circuits for selecting the cells, from those read simultaneously, which require soft programming pulses.

What is claimed is:

1. A method for controlled erasing non-volatile memory devices, in particular flash-EEPROM devices, comprising the steps of:

supplying at least one erase pulse to cells of a memory array; verifying that the erased cells have a threshold voltage which is lower than a first threshold value;

comparing said threshold voltage of the erased cells with a second threshold value, which is lower than said first threshold value; and selectively soft-programming the erased cells which have a threshold voltage lower than said second threshold value.

2. The method according to claim 1 wherein said steps of comparing and selectively soft-programming are carried out before said step of verifying.

3. The method according to claim 2 wherein said step of verifying, if at least one pre-determined number of erased cells has a threshold voltage which is higher than said first threshold value, the step is carried out of applying an erase pulse to said erased cells and repeating said steps of comparing, selectively soft-programming and verifying.

4. The method according to claim 1 wherein said step of comparing comprises the steps of:

a) addressing a first cell from said erased cells;
   b) read biasing said cell addressed;
   c) generating a first comparison signal which has a first comparison value, if said addressed cell has a threshold voltage which is greater than said second threshold value, and otherwise generating a second comparison value;
   d) if said first comparison signal has said first comparison value, addressing a cell following said addressed cell, from said erased cells, and returning to said step b);
   e) if said first comparison signal has said second comparison value, updating a repetition counter; applying a soft-programming pulse to said addressed cell; read biasing said addressed cell; and updating said first comparison signal;
   f) if said first comparison signal has said first comparison value, addressing a cell following said addressed cell, and returning to said step b);
   g) if said first comparison signal has said second comparison value, and said repetition counter is lower than a predetermined repetition value, returning to said step e);
   h) if said first comparison signal has said second comparison value, and said repetition counter is higher than a predetermined repetition value, addressing a cell following said addressed cell and returning to said step b).

5. The method according to claim 4 wherein said step h) an anomaly signal is generated; and wherein on completion of said steps of comparing all said cells erased, in the presence of said anomaly signal, said steps from a) to h) are repeated.

6. The method according to claim 1 wherein said step of verifying comprises the steps of:

i) addressing a first cell from said erased cells;
   j) read biasing said addressed cell;
   k) generating a second comparison signal having a third comparison value, if said cell addressed has a threshold voltage which is lower than said first threshold value, and otherwise a fourth comparison value;
   l) if said second comparison signal has said third comparison value, addressing a cell following said addressed cell and returning to said step j); and
   e) if said second comparison signal has said fourth comparison value, generating an incorrect erase signal; applying an erase pulse to said cells, and repeating said steps of comparing and selectively verifying.

7. A non-volatile memory device, in particular a flash-EEPROM device, comprising:

a memory array including a plurality of cells;
   address circuits, connected to said memory array, for addressing one of said cells;
   a read and comparison circuit, connected to said memory array through said address circuits;
   an operative voltage generation unit connected to said address circuits, to said memory array, and to said read and comparison circuit; and
   a control unit, connected to said address circuits, to said read and comparison circuit and to said operative voltage generation unit; said control unit comprising erase pulse generation control means, connected to said address circuits and to said operative voltage generation unit, and controlling transmission of an erase pulse to said cells, and verify means connected to said read and verify circuit and verifying whether the erased cells have a threshold voltage lower than a first threshold value wherein said control unit comprises comparison enabling means connected to said read and comparison circuit and to said operative voltage generation unit, and enabling comparison between the threshold voltage of the erased cells and a second threshold value lower than said first threshold value; and selective soft-programming control means for selective soft-programming the erased cells which have a threshold voltage lower than said second threshold value.

8. The memory device according to claim 7 wherein said control unit comprises detection means for non-erased cells, detecting the presence of a predetermined number of erased cells which have a threshold voltage higher than said first threshold value; and sequential activation means enabled by said detection means for not erased cells, and sequentially enabling said erase pulse generation control means, said comparison enabling means, said selective soft-programming control means, and said verify means.

9. A method for erasing non-volatile memory cells comprising:

erasing the cells with a first pulse;

comparing the threshold voltage of each cell to a first threshold voltage; and if any cells have a threshold voltage that is below the first threshold, soft-programming only those cells, wherein soft-programming the cells comprises:

selecting a cell that has a threshold voltage lower than the first threshold voltage;

initializing a counter;

updating the counter;

applying a soft-programming pulse to the selected cell;

again comparing the threshold voltage of the selected cell to the first threshold voltage; and repeatedly updating the counter, applying the soft-programming pulse, and comparing the threshold voltage of the selected cell to the first threshold voltage until either the threshold voltage of the selected cell is above the first threshold voltage or until the counter equals a predetermined stop value, whichever happens first.

10. The method of claim 9, further comprising:

comparing the threshold voltage of each cell to a second threshold voltage; and concluding if all of the cells are below the second threshold voltage.

11. The method of claim 10, further comprising:

if any of the cells have a threshold voltage that is above the second threshold voltage, repeating all of the steps of claim 9.

12. The method of claim 10 wherein comparing the threshold voltage of each cell comprises:

addressing a first cell;

biasing the addressed cell;

applying a comparison voltage to a sense amplifier in order to produce a first output if the threshold voltage of the addressed cell is below the threshold voltage being tested and to produce a second output if the threshold voltage of the addressed cell is above the threshold voltage being tested; and reading the output of the sense amplifier.

\* \* \* \* \*